(12) United States Patent
Burton et al.

(10) Patent No.: US 11,043,459 B2
(45) Date of Patent: Jun. 22, 2021

(54) MULTIPLE RETICLE FIELD SEMICONDUCTOR DEVICES

(71) Applicant: INTEL CORPORATION, Santa Clara, CA (US)

(72) Inventors: Edward A. Burton, Hillsboro, OR (US); Mark T. Bohr, Aloha, OR (US); Murray Fitzpatrick Kelley, Albuquerque, NM (US); Shawn Michael Klauser, Draper, UT (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/611,129

(22) PCT Filed: Jun. 29, 2017

(86) PCT No.: PCT/US2017/039990
§ 371 (c)(1),
(2) Date: Nov. 5, 2019

(87) PCT Pub. No.: WO2019/005068
PCT Pub. Date: Jan. 3, 2019

(65) Prior Publication Data
US 2020/0066651 A1 Feb. 27, 2020

(51) Int. Cl.
*H01L 23/544* (2006.01)
*H01L 23/538* (2006.01)
*G03F 7/20* (2006.01)

(52) U.S. Cl.
CPC ........ *H01L 23/544* (2013.01); *G03F 7/70741* (2013.01); *H01L 23/5384* (2013.01); *H01L 23/5385* (2013.01); *H01L 23/5386* (2013.01)

(58) Field of Classification Search
CPC ............... H01L 23/544; H01L 23/5384; H01L 23/5385; H01L 23/5386; G03F 7/70741
(Continued)

(56) References Cited

U.S. PATENT DOCUMENTS 5,837,557 A    11/1998  Fulford, Jr.
6,027,859 A *   2/2000  Dawson ............. G03F 7/70475
                                                 430/311

(Continued)

FOREIGN PATENT DOCUMENTS

KR        10-0735526 B1      7/2007
WO        2019005068 A1      1/2019

OTHER PUBLICATIONS

PCT Search Report & Written Opinion for PCT Application No. PCT/US2017/039990 filed on Jun. 29, 2017, dated Mar. 28, 2018, 11 pages.

(Continued)

*Primary Examiner* — Tong-Ho Kim
(74) *Attorney, Agent, or Firm* — Schwabe, Williamson & Wyatt, P.C.

(57) ABSTRACT

Techniques are described for fabricating integrated circuit devices that span multiple reticle fields. Integrated circuits formed within separate reticle fields are placed into electrical contact with each other by overlapping reticle fields to form an overlapping conductive interconnect. This overlapping conductive interconnect electrically connects an interconnect layer of a first reticle field with an interconnect layer of a second, laterally adjacent reticle field. The overlapping conductive interconnection extends into a common scribe zone between adjacent reticle fields.

20 Claims, 6 Drawing Sheets

(58) Field of Classification Search
USPC .......................................................... 257/620
See application file for complete search history.

(56) References Cited

U.S. PATENT DOCUMENTS

| | | |
|---|---|---|
| 6,194,105 B1 | 2/2001 | Shacham et al. |
| 8,519,543 B1 | 8/2013 | Song et al. |
| 2010/0013059 A1* | 1/2010 | Hsieh .................... H01L 23/585 |
| | | 257/620 |
| 2010/0164053 A1* | 7/2010 | Furumiya ............... H01L 24/06 |
| | | 257/503 |
| 2013/0015587 A1 | 1/2013 | Okutsu et al. |
| 2014/0175666 A1 | 6/2014 | Rahman et al. |
| 2014/0252572 A1 | 9/2014 | Hou et al. |
| 2015/0082265 A1 | 3/2015 | Huang et al. |

OTHER PUBLICATIONS

International Preliminary Report on Patentability received for PCT Application No. PCT/US2017/039990, dated Dec. 31, 2019. 7 pages.
Search Report from European Patent Application No. 17915401.8, dated Dec. 22, 2020, 10 pgs.

* cited by examiner

352

356

360

364

368

MULTIPLE RETICLE FIELD SEMICONDUCTOR DEVICES

CROSS-REFERENCE TO RELATED APPLICATIONS

This patent application is a U.S. National Phase Application under 35 U.S.C. § 371 of International Application No. PCT/US2017/039990, filed on Jun. 29, 2017, the entire contents of which is hereby incorporated by reference herein.

BACKGROUND

Photolithographic patterning of integrated circuits generally involves exposing a lithographically active material to radiation in a pattern corresponding to the features to be fabricated. The lithographically active material is processed to selectively remove material exposed (or not exposed) to the radiation. Other materials can then be formed in areas from which the lithographically active material has been removed (e.g., an electrically conductive material, an electrically insulative material, an implanted dopant). This process can be repeated many times within any of the many levels of an integrated circuit. In particular, the process can be used to fabricate devices at a transistor level proximate to a semiconducting substrate (also referred to as the "front end of line" or "FEOL") through to a top level of conductive interconnects (also referred to as the "back end of line" or "BEOL") that connect millions of transistors together.

Selective exposure of the lithographically active material to radiation is accomplished using a "mask" or "reticle." The reticle includes a substrate that is transparent to the wavelength or wavelengths of radiation used to expose the lithographical active material. On the reticle substrate is a pattern of material that is opaque to the wavelength(s) of radiation used to expose the lithographically active material. Alternatively, the pattern can be transparent to the radiation and the reticle is opaque. In any case, the reticle pattern corresponds to the features to be formed on the semiconducting substrate and/or integrated circuit. Patterns on the reticle can be "positive" or "negative" depending on the features to be patterned and the chemistry of the materials involved.

A reticle can be configured to print multiple die (i.e., the "chip" ultimately removed from a larger substrate), or more specifically, one level or part of one level within multiple die, at a time. This is because die are usually smaller than a reticle field size, which generally has an upper limit of 33 mm by 26 mm. This upper limit is based on current industry conventions and is used as a standard for configuring manufacturing tools, although is not intended to limit the present disclosure, as will be appreciated. In some cases, a single die is printed by a single reticle. In some cases, the die printed by the reticle are not fully coextensive with the reticle field size so as to leave room for strip that may include test structures or alignment marks (sometimes referred to as "fiducials") that are used to align reticles during processing. In some cases, the strip is also used as a scribe zone. The scribe zone is free of functional circuits associated with the final integrated circuit because the scribe zone is intended to be sawed through to separate the completed die from one another.

Regardless of the number of die within a reticle, the reticle is incrementally moved or "stepped" over a surface of the given substrate. This progressively exposes adjacent, and not overlapping, portions of the substrate surface to the pattern of the reticle. In this way, the pattern in a reticle can be used to fabricate a corresponding pattern of integrated circuit structures over some or all of the substrate surface.

Figure 1:
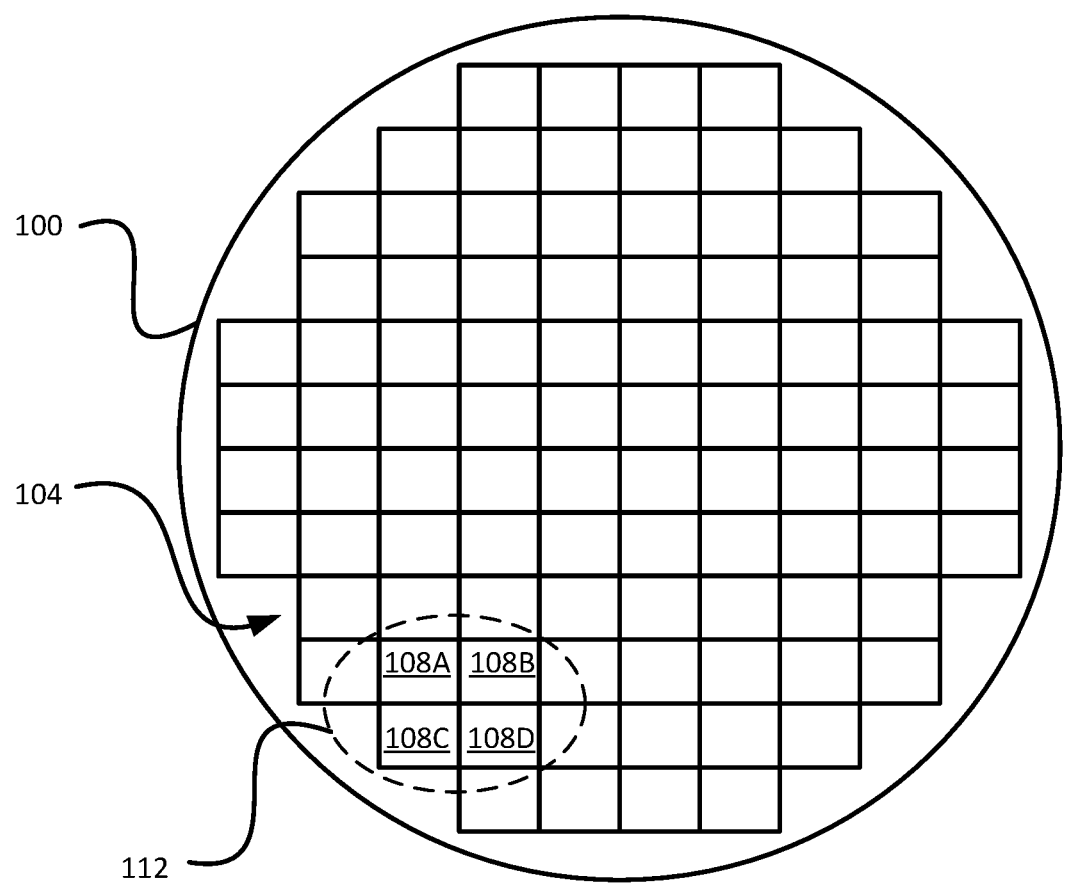
FIG. 1 is a plan view illustration of integrated circuit die patterned within a reticle field on a semiconducting wafer.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are described for fabricating integrated circuit devices that span multiple reticle fields. While integrated circuit devices are often disposed within a single reticle field, various embodiments described herein include integrated circuit devices that are not so limited. Rather, the integrated circuits formed within separate reticle fields are placed into electrical contact with each other by overlapping adjacent reticle fields during patterning steps so as to form overlapping conductive interconnects. These overlapping conductive interconnects connect the integrated circuits by spanning the overlapped portion of the reticle fields. In one particular embodiment, the overlapping conductive interconnect electrically connects a conductive interconnect in an interconnect layer of a first reticle field with a conductive interconnect in an interconnect layer of a second, adjacent reticle field. As will be appreciated in light of this disclosure, the overlapping conductive interconnections extend into a common scribe zone between adjacent reticle fields. By connecting the interconnect layers of the first and second reticle fields together through the overlapping conductive interconnect, one or more integrated circuits associated with the first and second reticle fields are placed in electrical contact with one another. In one particular embodiment, overlapping conductive interconnects for a single interconnect structure that can span from one edge of a first die formed in a first reticle field to an opposing edge of a second die formed in an adjacent second reticle field. In this way, an integrated circuit device that spans multiple reticle fields can be fabricated. In some cases, the laterally adjacent interconnect layers of the first and second reticle fields that are connected together by the overlapping conductive interconnect are intermediate interconnect layers, such that there are one or more additional interconnect layers above the laterally adjacent interconnect layers, as well as one or more additional interconnect layers below the laterally adjacent interconnect layers. Numerous other configurations will be apparent.

General Overview

As previously explained, die are usually smaller than a reticle field size, given current industry standards. However, it might be inconvenient to have just one die associated with a reticle field. For example, it may be advantageous to have an integrated circuit die that exceeds the reticle field size of a single reticle (usually 33 mm by 26 mm, as indicated above, per current standards). In a specific example, large die, sometimes as much as two times, three times, or more of the maximum reticle field size may be desired for computationally intensive applications (e.g., server or image processing applications). These large die can be fabricated by adding at least one additional layer of metal interconnects to an external input/output (I/O) contact of one die to an external I/O contact of an adjacent die. In this context, the term "external" refers to a surface that is not within an interconnect layer of the BEOL or otherwise between neighboring interconnect layers, but rather is a surface used to connect a fully formed die to an electronic package (uppermost surface of a fully formed die). This type of conductive interconnect can be referred to as a "stitch" or a "stitching layer." For instance, a stitching layer interconnect is disposed outside the interconnect layers of an integrated circuit and in contact with I/O contacts of a die used to connect the die to wires to an electronic package. In another example of the traditional reticle/die configuration, die having similar architectures but different sizes still require different reticle sets, again increasing fabrication costs and cycle times. In a specific example, similarly configured die that use a same design of cores (that is, repeatable groups of logic circuits, repeatable groups of memory cells, etc.) but in different numbers (e.g., a 10 core logic circuit versus a 20 core logic circuit of the same design as the 10 core logic circuit) nevertheless will use separate reticle sets for their respective fabrication. While similar architectures with different core quantities is used as an example here, this challenge is the case for any number of repeatable integrated circuit components. Similar architectures of die that differ primarily in the number of cores, the number of high speed input/output channels, double data rate (DDR) channels, among other components, still need distinct reticle sets.

Thus, in accordance with an embodiment of the present disclosure, techniques are described for an integrated circuit die larger than a single reticle field size. Multi-reticle die of the present disclosure can be fabricated by overlapping a first reticle field with a second reticle field so that the first reticle field and the second reticle field have a common scribe zone. This allows an overlapping conductive interconnect to be fabricated. The overlapping conductive interconnect connects a first interconnect layer (and possibly one or more integrated circuit devices associated with the first reticle field) to a second interconnect layer (and possibly one or more integrated circuit devices associated with the second reticle field). In examples, the overlapping conductive interconnect spans a common scribe zone between the first and second reticle fields. Note that the overlapping conductive interconnect is distinct from a stitching layer interconnect disposed on the uppermost surface of a fully-formed die. For instance, two or more laterally adjacent interconnect layers of the first and second reticle fields that are connected together by the overlapping conductive interconnect are sandwiched or otherwise disposed between additional interconnect layers or device layers or some combination of device and interconnect layers.

Advantages of the present disclosure enable the design and fabrication of integrated circuit devices that are larger than a given industry standard reticle field size (e.g., 33 mm by 26 mm) and that have overlapping interconnections within or otherwise between BEOL interconnect layers. This allows electrical connection between integrated circuits that is more precisely tailored than otherwise possible when using a stitching layer. Another advantage is the fabrication of integrated circuit devices having a different number of cores but otherwise similar designs to use a common reticle set. A number of cores, whether for a multi-reticle field die or not, can be increased by merely repeatedly using a single reticle to produce a die having a multiple of the number of cores within the reticle. In this way, a single reticle set can be used for many different die having a different multiple of a number of cores.

Single Reticle Field Die

FIG. 1 illustrates a semiconducting substrate 100, on which is disposed a plurality of lithographically exposed reticle fields 104.

Examples of the semiconducting substrate 100 include a bulk substrate including group IV semiconductor material, such as silicon (Si), germanium (Ge), silicon germanium (SiGe), or silicon carbide (SiC), and/or at least one group III-V material and/or any other suitable material(s) as will be apparent in light of this disclosure; an X on insulator (XOI) structure where X is one of the aforementioned materials (e.g., group IV and/or group III-V semiconductor material) and the insulator material is an oxide material or dielectric material or some other electrically insulating material; or some other suitable multilayer structure where the top layer includes one of the aforementioned materials (e.g., group IV and/or group III-V semiconductor material). As previously described, the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. It will be appreciated that these examples of the substrate 100 are provided for illustration only and that embodiment of the present disclosure can be applied to photolithographic processes independent from the composition of the substrate 100.

Individual reticle fields of the plurality of reticle fields 104 correspond to an outer boundary of an image projected onto the surface of the semiconducting substrate 100 (or a layer of a semiconducting device on the substrate 100) by exposing a reticle to radiation. As described above, a pattern on a reticle is projected onto a lithographically active material on the substrate 100. This pattern generally corresponds to a layer, or part of a layer, within an integrated circuit device. A semiconductor device is progressively fabricated by exposing the lithographically active material to radiation of the pattern, "developing" the pattern, and then forming material corresponding to features of the developed lithographically active material.

An individual reticle field also can include a scribe zone around a perimeter of the reticle field. These are indicated by the lines between the individual reticle fields of the plurality 104, and also shown in more detail in subsequent figures. The scribe zone corresponds to a sacrificial zone between individual reticle fields that is sawed, scored, or cut so as to separate individual die (each of which generally corresponds to some or all of one reticle field) from the semiconducting substrate 100. The scribe zone can include alignment marks (also referred to as "fiducials") and in some cases, can also include test structures used for testing quality and/or reliability of integrated circuit devices on a die or within an associated reticle field.

As indicated above, reticle fields, such as the reticle fields 104, typically have an industry standard size. In some examples, this industry standard reticle field size is 33 mm×26 mm. Regardless of the reticle size, reticles are moved (or "stepped") so that individual reticle fields are projected onto a surface of the substrate 100 so that they abut but do not overlap. This can produce a maximum number semiconducting die that can be fit onto a surface of the substrate. Avoiding overlap of reticle fields can prevent yield loss due to flawed patterning. Preventing overlap between the adjacent reticle fields also allows use of the intervening scribe zones for alignment marks and test structures, as described above.

Indicated in FIG. 1 is a group 112 of individual reticle fields 108A, 108B, 108C, and 108D. This group 112 and the individual reticle fields 108A, 108B, 108C, and 108D are presented and described below in more detail in the context of FIGS. 2A and 2B.

Figure 2A:
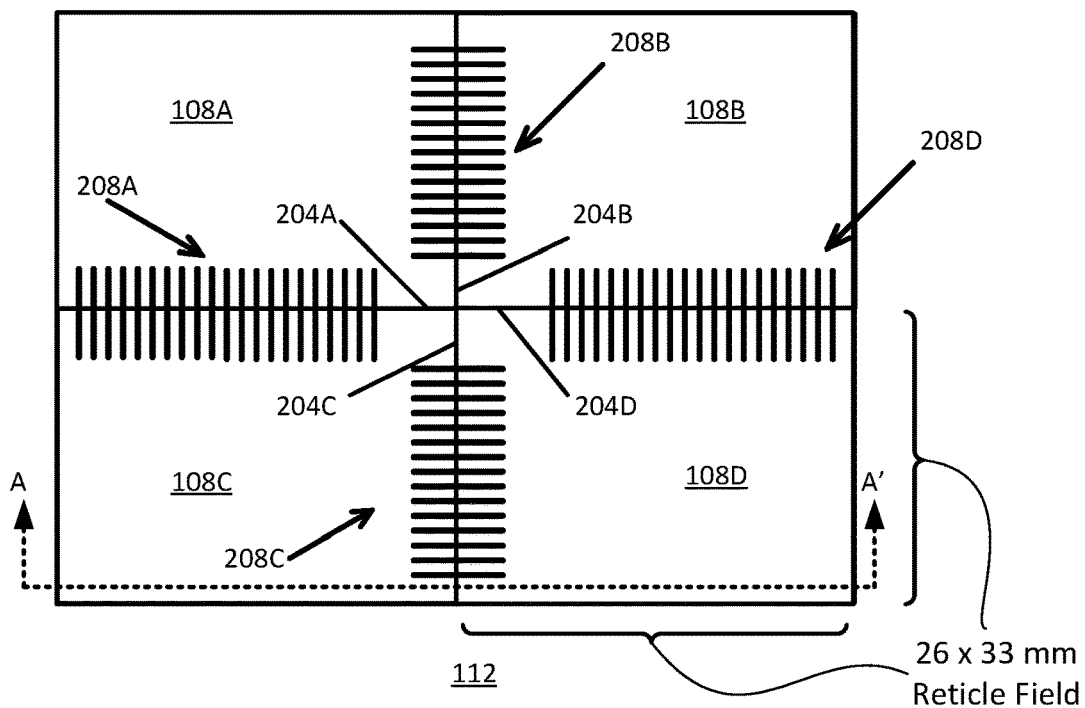
FIG. 2A is a plan view illustration of "stitching" interconnects that place multiple semiconductor die, each of which is fabricated within one reticle field, in electrical contact with one another by connecting external input/output contacts associated with the individual die.

FIG. 2A is a plan view of the group 112 of individual reticle fields 108A-108D. Specifically, the plan view of FIG. 2A is on an external surface of a die corresponding to the group 112. This external surface includes structures that can be used to connect the die to an electronic package. As indicated above, the individual reticle fields 108A-108D in this example each correspond to an industry standard maximum reticle size of 26 mm×33 mm.

The group 112 also includes scribe zones 204A, 204B, 204C, and 204D as well as stitching interconnections 208A, 208B, 208C, and 208D.

As shown in FIG. 2A, each of the individual reticle fields 108A-108D is separated from adjacent reticle fields by a scribe zone. In the example group 112 of reticle fields, reticle field 108A is separated from reticle field 108B by scribe zone 204B, and separated from reticle field 108C by scribe zone 204A. Reticle field 108D is separated from reticle field 108B by scribe zone 204D and separated from reticle field 108C by scribe zone 204C. As described above, the scribe zones are locations at which adjacent reticle fields abut one another, but do not overlap. Because scribe zones may optionally include alignment marks (used to align reticles within a level or between different levels) or test structures (to model or determine integrated device operation), the lack of overlap between reticle fields, including the scribe zones of adjacent reticle fields, is useful.

Figure 2B:
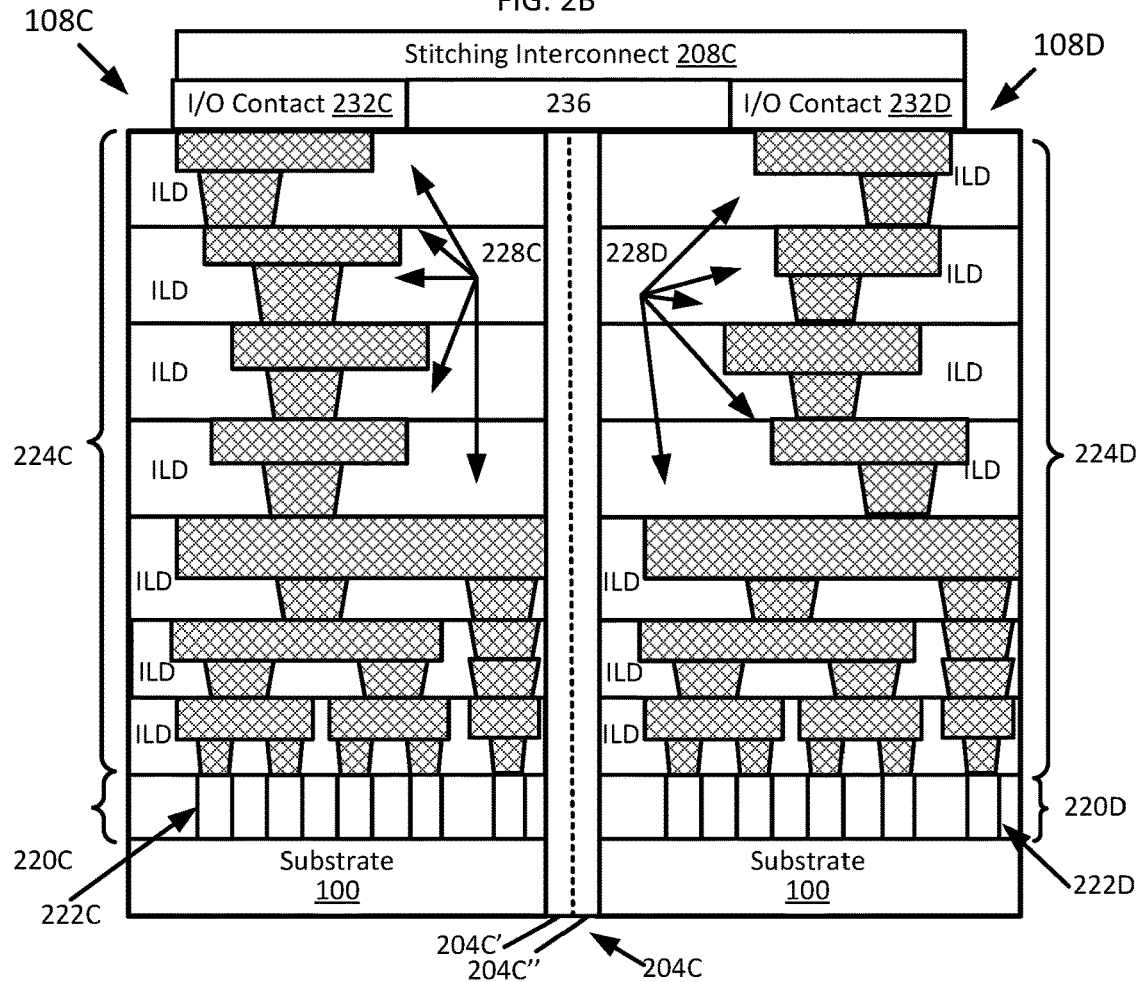
FIG. 2B is a top-to-bottom cross-sectional view taken in the direction indicated in FIG. 2A of two adjacent die that are placed into electrical contact with one another using a stitching interconnect on external input/output contacts.

As described above, integrated circuits formed within reticle fields 108A-108D are electrically connected using "stitching" interconnections 208A-208D. Specifically, the integrated circuits within the reticle field 108A are connected to integrated circuits within 108B via stitching interconnections 208B and are connected to integrated circuits within 108C via stitching interconnects 208A. Integrated circuits within reticle field 108D are connected to integrated circuits within reticle field 108B via stitching interconnections 208D and are connected to integrated circuits within reticle field 108C via stitching interconnections 208C. As described above, the stitching interconnections 208A-208D connect integrated circuits within adjacent reticle fields to one another by electrically connecting external I/O contacts associated with the adjacent reticle fields to one another. Generally the stitching interconnections 208C are disposed mostly over the scribe region and do not extent from one edge of a reticle field to an opposing edge of an adjacent reticle field, as illustrated in FIG. 2B. A cross-section of the group 112, and more specifically reticle fields 108C and 108D taken along the line A-A' is presented in FIG. 2B.

FIG. 2B illustrates a cross-sectional view of reticle fields 108C and 108D. The structures circuits associated with each of the reticle fields 108C and 108D include the substrate 100, corresponding device layers 220C and 220D, corresponding back end of line interconnect (BEOL) layers 224C and 224D, and corresponding external I/O contacts 232C and 232D.

The substrate 100 has been described above and needs no further explanation. The device layers 220C and 220D formed on the substrate 100 include semiconductor devices 222C and 222D. Examples of semiconductor devices include, but are not limited to various types of field effect transistors (FETs), finFETs, planar FETs, MOSFETs, as well as many other types of semiconductor devices.

The semiconductor devices 222C of within the reticle field 108C are selectively connected to one another by a series of BEOL interconnect layers 224C. Analogously, the semiconductor devices 222D within the reticle field 108D are selectively connected to one another by a series of BEOL interconnect layers 224D. Individual interconnect layers generally comprise a conductive interconnect, whether a via or a conductive line. Both of these structures are indicated in the BEOL interconnect layers 224C and 224D as conductive interconnects 228C and 228D, respectively.

An electrically insulating material, commonly referred to as interlayer dielectric or "ILD," separates the various conductive interconnects (e.g., 228C and 228D) so as to reduce the likelihood of electrical shorting between interconnects. Example materials for ILD include, but are not limited to nitrides (e.g., $Si_3N_4$), oxides (e.g., $SiO_2$, $Al_2O_3$, $AlSiO_x$), oxynitrides (e.g., $SiO_xN_y$), carbides (e.g., SiC), oxycarbides, polymers, silanes, siloxanes, or other suitable insulator materials. In some embodiments, the ILD is implemented with ultra-low-k insulator materials, low-k dielectric materials, or high-k dielectric materials depending on the application. Example low-k and ultra-low-k dielectric materials include porous silicon dioxide, carbon doped oxide (CDO), organic polymers such as perfluorocyclobutane or polytetrafluoroethylene, fluorosilicate glass (FSG), and organosilicates such as silsesquioxane, siloxane, or organosilicate glass. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

As mentioned above, the various conductive interconnects 228C and 228D are disposed in the BEOL interconnect layers 224C and 224D, respectively and connect various groups of semiconductor devices within a corresponding device layer 220C, 220D to one another. In examples, conductive interconnects at layers further from a device layer connect larger groups of semiconductor devices compared to layers closer to the device layer.

The reticle fields 108C and 108D are separated by scribe zone 204C. The scribe zone 204C includes two portions: first portion 204C' is associated with the reticle field 108C and second portion 204C" is associated with the reticle field 108D. These two portions 204C' and 204C" are included to illustrate the abutment of two adjacent reticle fields that do not overlap. Each of these portions 204C' and 204C" may include alignment marks and test structures that are associated with a corresponding reticle field, as described above.

External I/O contacts, such as I/O contacts, 232C and 232D, are electrically conductive structures that are external to the BEOL interconnect layers. These structures can be electrically insulated from one another by an insulating barrier material 236, often a polyimide. In some examples, like the one shown in FIG. 2B, the I/O contacts 232C and 232D are disposed on an exposed external surface of a die. I/O contacts 232C and 232D act as a conductive interface between the top-most conductive interconnect of 228C and 228D and a conductive structure associated with an electronic package (not shown), such as a controlled collapse chip connection ("C4") solder joint, wirebond lead wire and solder joint, or other similar structure. In some examples, the physical dimensions of the I/O contacts 232C and 232D, and the spacing (or "pitch") between neighboring I/O contacts can be larger than the dimensions and pitches found within BEOL interconnect layers in some examples.

The stitching interconnect 208C places the BEOL interconnect layers 224C and 224D, and the semiconductor devices 222C and 22D, in electrical contact with one another via 232C and 232D. As will be appreciated from the preceding description, the stitching interconnect 208C is disposed on an external surface of the die corresponding to the reticle fields 108C and 108D, and is not disposed within the BEOL interconnect layers 224C, 224D. Furthermore, the dimensions of the stitching interconnect 208C are comparable to those of the I/O contact 232C and I/O contact 232D, namely on the order of 10 microns to 100 microns, or greater.

Multiple Reticle Field Die

Figure 3A:
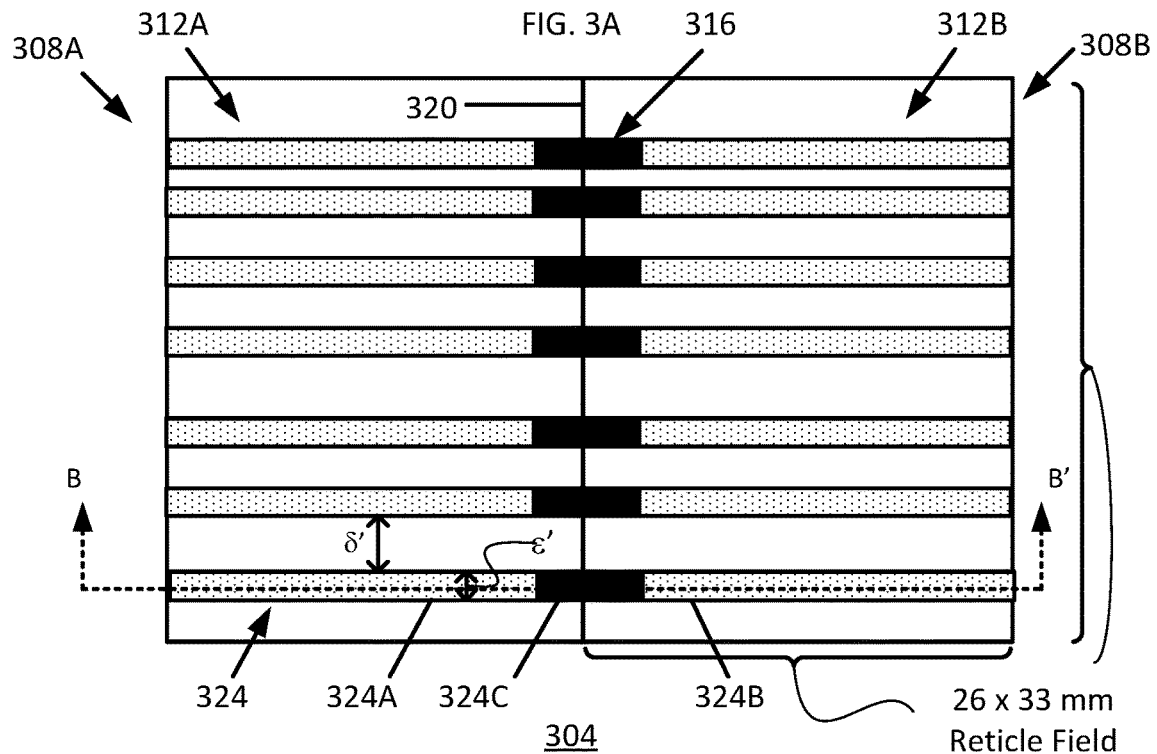
FIG. 3A is a plan view illustration of adjacent semiconductor die placed into electrical contact with one another using overlapping conductive interconnects within a BEOL interconnect layer, in accordance with an embodiment of the present disclosure.
Figure 3B:
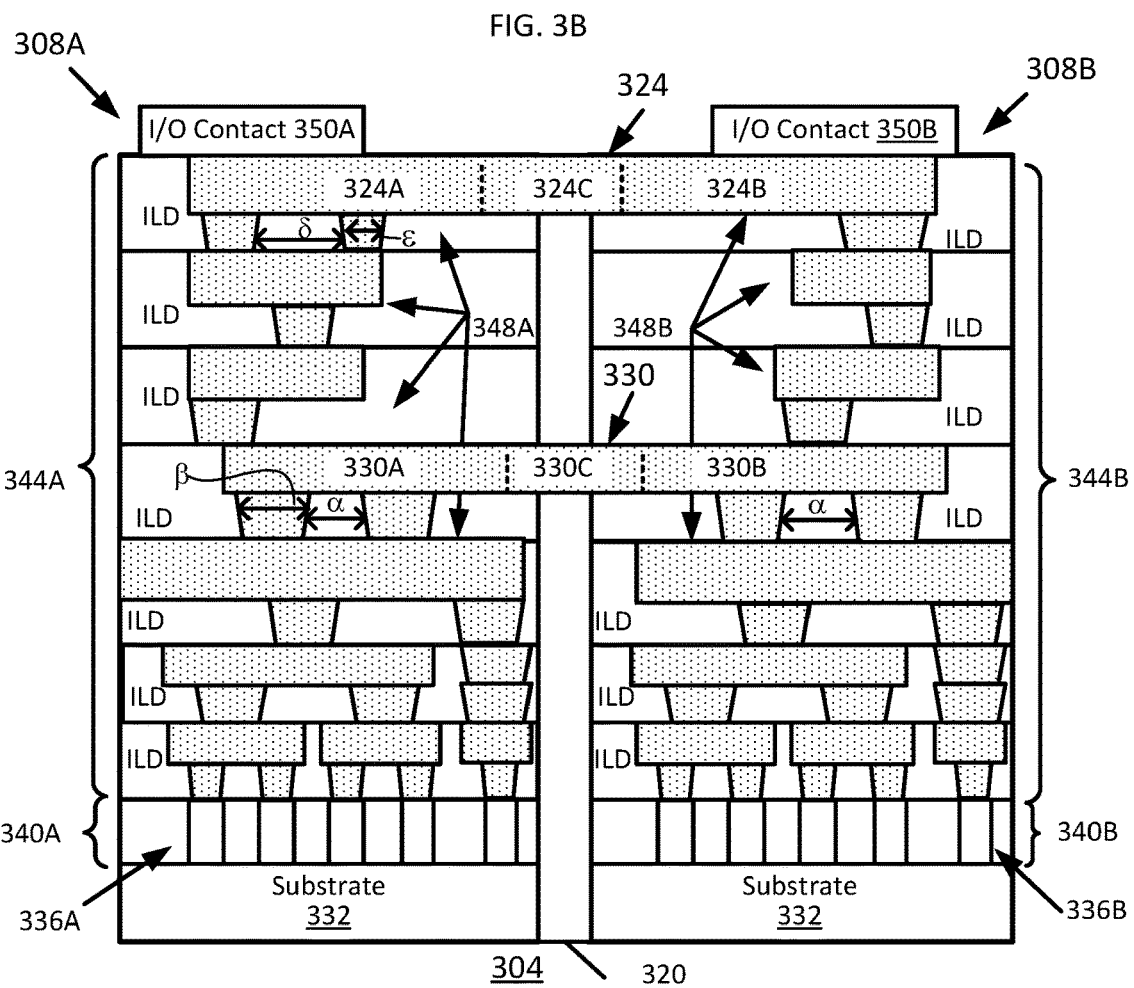
FIG. 3B is a cross-sectional view taken in the direction indicated in FIG. 3A of adjacent semiconductor die placed that are into electrical contact with one another using overlapping conductive interconnects within a BEOL interconnect layer, in accordance with an embodiment of the present disclosure.

FIGS. 3A and 3B illustrate a plan view and cross-sectional view of two adjacent die, corresponding to the reticle fields 308A and 308B, that have been placed into electrical contact with one another using an overlapping conductive interconnect. As described below, the overlapping conductive interconnect is disposed within a BEOL interconnect layer and, in some examples, forms a conductive interconnect that spans from one edge of a first die formed in a first reticle field to an opposing edge of an adjacent second die formed in a second reticle field. Thus connected through an overlapping conductive interconnect, the two reticle fields 308A and 308B effectively become a single die 304 that is larger than a single reticle field and is comprised of multiple reticle fields that can be larger than an industry standard maximum reticle field size.

The plan view of FIG. 3A illustrates the multi-reticle field die 304 that includes a first reticle field 308A and a second reticle field 308B, which are separated by a scribe zone 320. Unlike the plan view in FIG. 2A, which is of an external surface of the die to which electronic package connections are made, the plan view in FIG. 3A is of a BEOL interconnect level below the I/O contact level. This distinction will be appreciated in light of the following description.

As shown, the first reticle field 308A includes BEOL conductive interconnects 312A and the second reticle field 308B includes BEOL conductive interconnects 312B. The dimensions, pitches, composition, and general configuration of conductive interconnects have been described above and needs no further explanation.

The conductive interconnects 312A and 312B are placed into electrical contact with one another via overlapping interconnect portion 316. Taking one interconnect specifically, both of the first reticle field 308A and second reticle field 308B include portions of an overlapping conductive interconnect 324, in an embodiment of the present disclosure. Specifically, the first reticle field 308A includes a first portion 324A of the overlapping conductive interconnect 324, and the second reticle field 308B includes a second portion 324B of the overlapping conductive interconnect 324. Between the first portion 324A and the second portion 324B is third portion 324C that electrically connects, and is integral with the first and second portions 324A, 324B.

FIG. 3B illustrates a cross-sectional view of the a portion of FIG. 3A as indicated by line B-B'. The multi-reticle field die 304 includes semiconductor devices and conductive interconnects associated with both the reticle field 308A and the reticle field 308B. The reticle fields 308A and 308B both include a substrate 332, which is analogous to the substrate 100 and needs no further explanation. The reticle field 308A includes a device layer 340A that further includes semiconductor devices 336A. The reticle field 308A also includes a series of BEOL interconnect layers 344A formed from conductive interconnects 348A and ILD. An I/O contact 350A is in contact on an exposed surface of the portion of the multi-reticle field die 304 associated with reticle field 308A. These structures are analogous to those described above in the context of FIGS. 2A and 2B and need no further explanation.

Similarly the reticle field 308B includes a device layer 340B that further includes semiconductor devices 336B. The reticle field 308B also includes a series of BEOL interconnect layers 344B formed from conductive interconnects 348B and ILD. An I/O contact 350B is in contact on an exposed surface of the portion of the multi-reticle field die 304 associated with reticle field 308B. These structures are analogous to those described above in the context of FIGS. 2A and 2B and need no further explanation.

Unlike the example depicted in FIG. 2B, the multi-reticle field die 304 of FIG. 3B includes two overlapping conductive interconnects 324 (also shown in FIG. 3A) and 330. Also unlike the example depicted in FIG. 2B, the scribe zone 320 does not include two abutting scribe zone portions, each of which is associated with one of the reticle fields. Rather, the scribe zone 320 is formed by the overlap of the reticle fields 308A and 308B.

In the example shown, the scribe zone 320 is a single scribe zone formed by the complete overlap of the scribe zone associated with the reticle field 308A and the scribe zone associated with the reticle field 308B. It will be appreciated that in other examples of a multi-reticle field die 308, the scribe zones associated with the individual reticle fields need not be completely coextensive, like the example 304, but rather can be configured to partially overlap.

The extent of overlap between the reticle fields in the scribe zone 320 is determined, in part, by the overlap used for fabricating a continuous conductive interconnect between the reticle fields and within an interconnect layer of the first reticle field 308A and the second reticle field 308B. In examples, the overlap between the reticle fields of the individual reticle fields 308A, 308B can overlap by as little as 5 nm or by as much as a micron. In other examples, the overlap between the reticle fields of the individual reticle fields 308A, 308B can be within any of the following ranges: from 5 nm to 100 nm; from 5 nm to 50 nm; from 5 nm to 20 nm; from 5 nm to 500 nm; from 100 nm to 500 nm; from 500 nm to 1 micron; from 250 nm to 750 nm.

Regardless, the multi-reticle field die 304 includes two overlapping conductive interconnects disposed within interconnect layers associated with the reticle fields 304A, 304B and within the associated common scribe zone 320.

Overlapping conductive interconnects, including overlapping conductive interconnects 324C and 330C, can be thought of as including a first portion, a second portion, and a third portion. The first portion is disposed within a BEOL interconnect layer of a first plurality of BEOL interconnect layers associated with a first reticle field. In FIG. 3B, this first portion is shown as first portions 324A and 330A in the reticle field 308A. The second portion is analogous to the first portion, being disposed within a BEOL interconnect layer of a second plurality of BEOL interconnect layer 344B associated with the second reticle field 308B. In FIG. 3B, this second portion is shown as second portions 324B and 330B in the reticle field 308B.

The third portion of the overlapping conductive interconnects, including 324C and 330C, is disposed between these first and second portions. As shown, the third portions is at least partially disposed within the common scribe zone 320. Like the common scribe zone 320, the third portion 324C, 330C is formed by an overlap of photolithographic features associated with the reticle fields 308A, 308B. In an example, the third portion 324C, 330C is an extension of one or both of a first portion 324A, 330C and a second portion 324B, 330B through the common scribe zone 320 (as indicated by dashed lines proximate 324C, 330C in FIG. 3B). This then forms a continuous conductor that electrically (and physically) connects one or more BEOL interconnect layers associated with the first reticle field 304A to one or more BEOL interconnects layers associated with the second reticle field 304B.

As shown, the overlapping conductive interconnects 324, 330 illustrated in FIG. 3B are distinct from the stitching interconnects illustrated in FIGS. 2A and 2B for at least several reasons. First, the overlapping conductive interconnects 324, 330 are disposed within BEOL interconnect layers 344A, 344B between their respective device layers (340A, 340B) and external I/O contacts 350A, 350B. This is unlike the stitching interconnects in FIG. 2A, 2B, which are in contact with external I/O contacts and not within BEOL interconnect layers.

Another structural distinction between the stitching interconnects and the overlapping conductive interconnects is that, as shown, the overlapping conductive interconnects 324, 330 are partially disposed with in the common scribe zone 320. As will be explained in detail in the context of FIGS. 4A and 4B, this is a consequence of overlapping the reticle fields 308A, 308B during patterning and formation of the interconnect layers associated with the overlapping conductive interconnects 324, 330. This process obviates the need for an additional reticles and patterning steps used to fabricate the stitching interconnections on an exposed surface of a die, as is used for stitching interconnections described above.

Still another structural distinction between the stitching interconnects and the overlapping conductive interconnects is the relative dimensions of these structures. As indicated above, stitching interconnections have dimensions that are on the order of 100 nm to 20 µm. In contrast, line width and spacing between the overlapping conductive interconnects 324, 330 and other interconnect structures are comparable to those of other interconnect structures (e.g., vias and conductive lines) in the interconnect layer in which the overlapping conductive interconnects are disposed. For example, FIG. 3B illustrates dimensions $\alpha$, $\beta$, $\delta$, and $\varepsilon$ that are associated with via interconnect structures. The values of these dimensions $\alpha$, $\beta$, $\delta$, and $\varepsilon$ are also applicable to overlapping conductive interconnect 330C within the same interconnect layer. This is illustrated in more detail in FIGS. 3A and 3B with respect to overlapping conductive interconnect 324. A spacing $\delta'$ between overlapping conductive interconnects 324 will be in a same range as the separation between interconnect structures (e.g., vias) also in that interconnect layer, and also indicated as $\delta$. Similarly, a line width $\varepsilon$ of an interconnect structure is also in a same range as a line width of overlapping conductive interconnect 324, indicated as $\varepsilon'$.

For illustration, the dimension a (spacing between vias/lines proximate to a device layer 340A, 340B) can be within any of the following ranges: 20 nm to 50 nm; from 20 nm to 25 nm; from 20 nm to 20 nm; from 25 nm to 50 nm. For illustration, the dimensions $\beta$, $\varepsilon$, and $\varepsilon'$ (line width) can be within any of the following ranges: 20 nm to 50 nm; from 20 nm to 25 nm; from 25 nm to 50 nm. For illustration, the dimensions $\varepsilon$ and $\varepsilon'$ (spacing between vias/lines within 344A, 344B but proximate to a I/O contacts 350A, 350B)) can be within any of the following ranges: from 50 nm to 500 nm; from 100 nm to 500 nm; from 250 nm to 500 nm; from 100 nm to 250 nm; from 500 nm to 1 micron; from 1 micron to 6 microns; from 1 micron to 3 microns; from 3 microns to 6 microns. A pitch associated with an overlapping conductive interconnect is an arithmetic sum of spacing and line width.

Figure 3C:
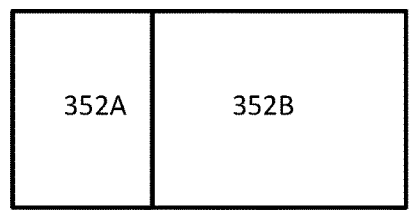
FIG. 3C is a schematic illustration of different patterns of die that can be placed into electrical contact with one another using overlapping conductive interconnects in one or more interconnect layers, in accordance with an embodiment of the present disclosure.
Figure 3C:
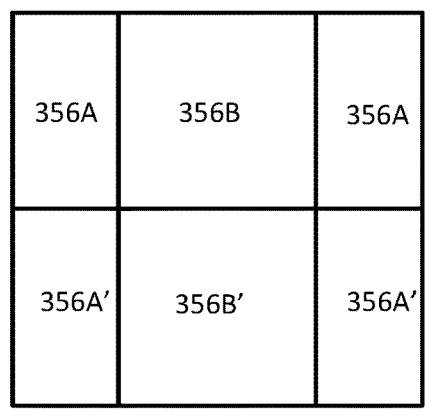
Figure 3C:
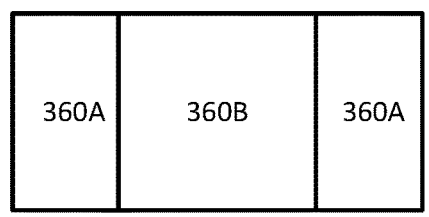
Figure 3C:
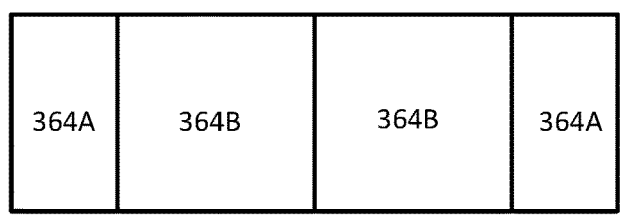
Figure 3C:
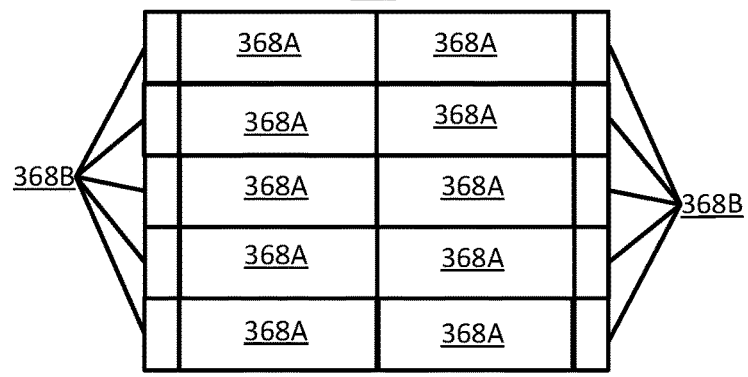

While FIGS. 3A and 3B show two adjacent reticle fields that are illustrated as having comparable widths, techniques described herein can be applied to any of a variety of reticle field sizes, shapes, and patterns to form a multi-reticle die, in embodiments of the present disclosure. FIG. 3C is a schematic illustration of different patterns of die that can be placed into electrical contact with one another user overlapping conductive interconnects in one or more interconnect layers, in accordance with an embodiment of the present disclosure. For example, multi-reticle die 352 includes a first reticle field 352A that is not symmetric with the overlapping and adjacent second reticle field 352B.

Example multi-reticle die 356 includes two types of reticle fields, 356A and 356B that are asymmetric and are each repeated three times in a 6 reticle field die 356. This example configuration can be used to fabricate a multi-reticle die 356 that includes different types of integrated circuit device types. For example, reticle field 356B and 356B' could be patterned to include memory cores or logic cores, and reticle fields 356A and 356A' could be patterned to include input/output circuits and/or control circuits in communication with the various memory and/or logic cores associated with the reticle fields 356B and 356B'.

The example multi-reticle die 360, 364, and 368 illustrate different, non-limiting, configurations in which different reticle fields can be associated with one another to produce differently configured multi-reticle die.

The multi-reticle die 368 illustrates an example described above in which one reticle containing a certain number of cores (e.g., a repeatable logic or memory semiconductor device associated with a reticle field) is repeated in a plurality of adjacent and overlapping reticle fields 368A. This can then produce an integrated circuit device on a single, multi-reticle field die that has a multiple of the number of cores in the reticle field. Furthermore, any multiple number of the base number of cores can be fabricated using a same reticle set for the base number of cores. For example, a reticle set used for patterning a single reticle field die of 10 logic cores can, by applying the overlapping conductive interconnect techniques described herein, be used to pattern a multi-reticle field die (such as 368) that includes 20 cores, 30 cores, 100 cores or more, without requiring a separate reticle set for each number of cores.

Continuing with multi-reticle die 368, the reticle fields 368B can include blocks of I/O circuits, controllers, DDR channels, among other devices, used to interact with the core circuitry in the reticle fields 368A. As described above, the semiconductor devices and circuits of the reticle fields 368B can be placed into electrical contact with each other and with the semiconductor devices and circuits of the reticle fields 368A using embodiments described herein.

Analytical Techniques

Use of the techniques and structures provided herein may be detectable using tools such as: electron microscopy including scanning/transmission electron microscopy (SEM/TEM), scanning transmission electron microscopy (STEM), and reflection electron microscopy (REM); 3D tomography; or high resolution physical or chemical analysis, to name a few suitable example analytical tools. In particular, in some embodiments, such tools may indicate a conductive interconnect spanning a common scribe zone to connect an interconnect of a BEOL interconnect layer associated with a first die to an interconnect of a BEOL interconnect layer associated with a second die. In some embodiments, such tools may indicate a step or slight variation in with due to a slight misalignment between the first portion and second portion of an overlapping conductive interconnect, as described above.

EXAMPLE METHOD

Figure 4A:
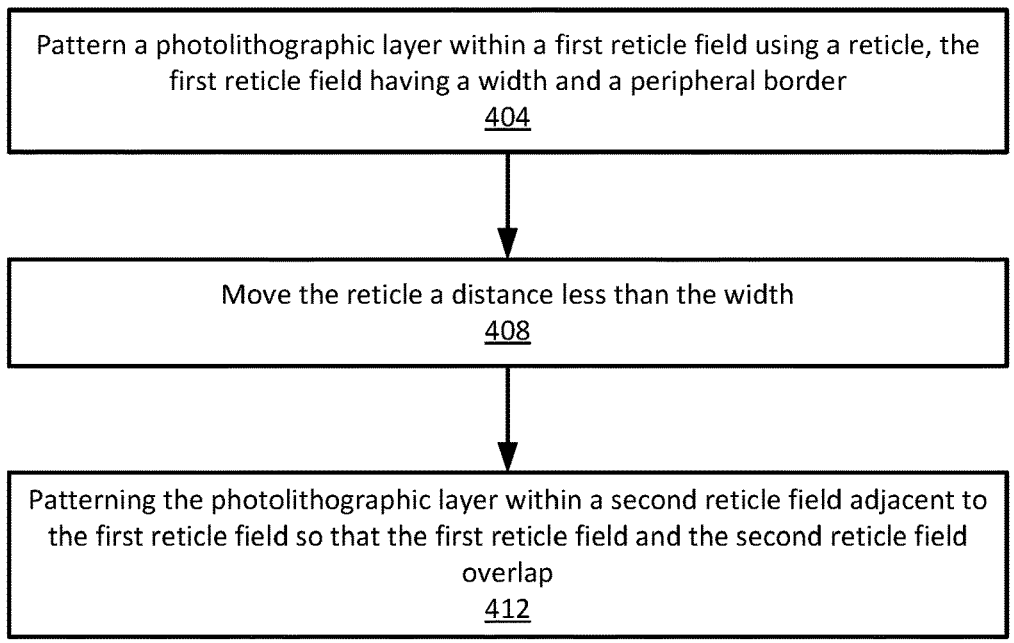
FIG. 4A is an example method flow diagram of a method for fabricating an overlapping conductive interconnect between two adjacent and overlapping reticle fields, in accordance with an embodiment of the present disclosure.
Figure 4B:
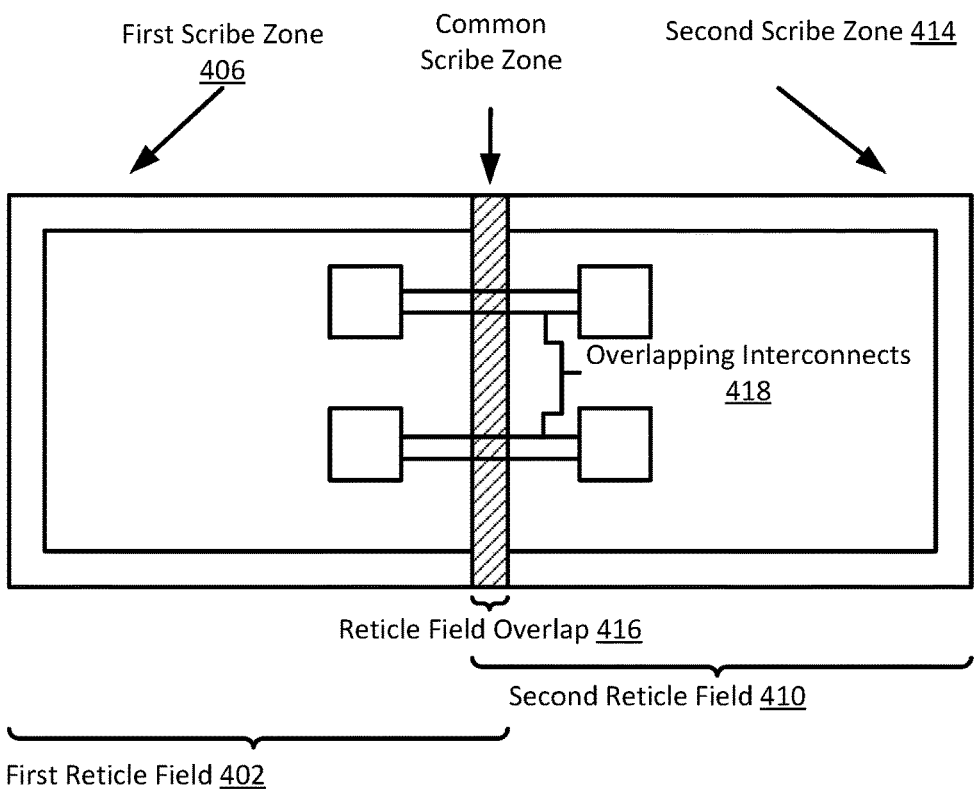
FIG. 4B is a plan view schematic figure illustrating structures formed by the example method depicted in FIG. 4A, in accordance with an embodiment of the present disclosure.

FIG. 4A illustrates an example method 400 for fabricated a multi-reticle field die that includes semiconductor devices connected by an overlapping conductive interconnect, in an embodiment. A plan view schematic is presented in FIG. 4B. Concurrent reference to FIGS. 4A and 4B will facilitate explanation of the method 400 and embodiments of the present disclosure.

The method 400 begins by patterning 404 a photolithographic layer of an integrated circuit device within a first reticle field 402 using a reticle. The first reticle field 402 has a width (indicated by the bracket in FIG. 4B) and includes a peripheral first scribe zone 406. The reticle used to pattern the first reticle field 402 is then moved 408 a distance less than the width of the first reticle field. The photolithographic layer is then patterned 412 in a second reticle field 410 adjacent to and overlapping with the first reticle field 402. The second reticle field 410, analogous to the first reticle field 402, includes a second scribe zone 414. The reticle field overlap 416 between the first reticle field 402 and the second reticle field 410 at their respective scribe zones 406, 414 forms a common scribe zone, as described above, and at least one overlapping conductive interconnect 418. The overlapping conductive interconnects 418 are disposed within BEOL interconnect layers of the first reticle field 402, the second reticle field 410, and the common scribe zone formed by the reticle field overlap 416, as also described above.

Example System

Figure 5:
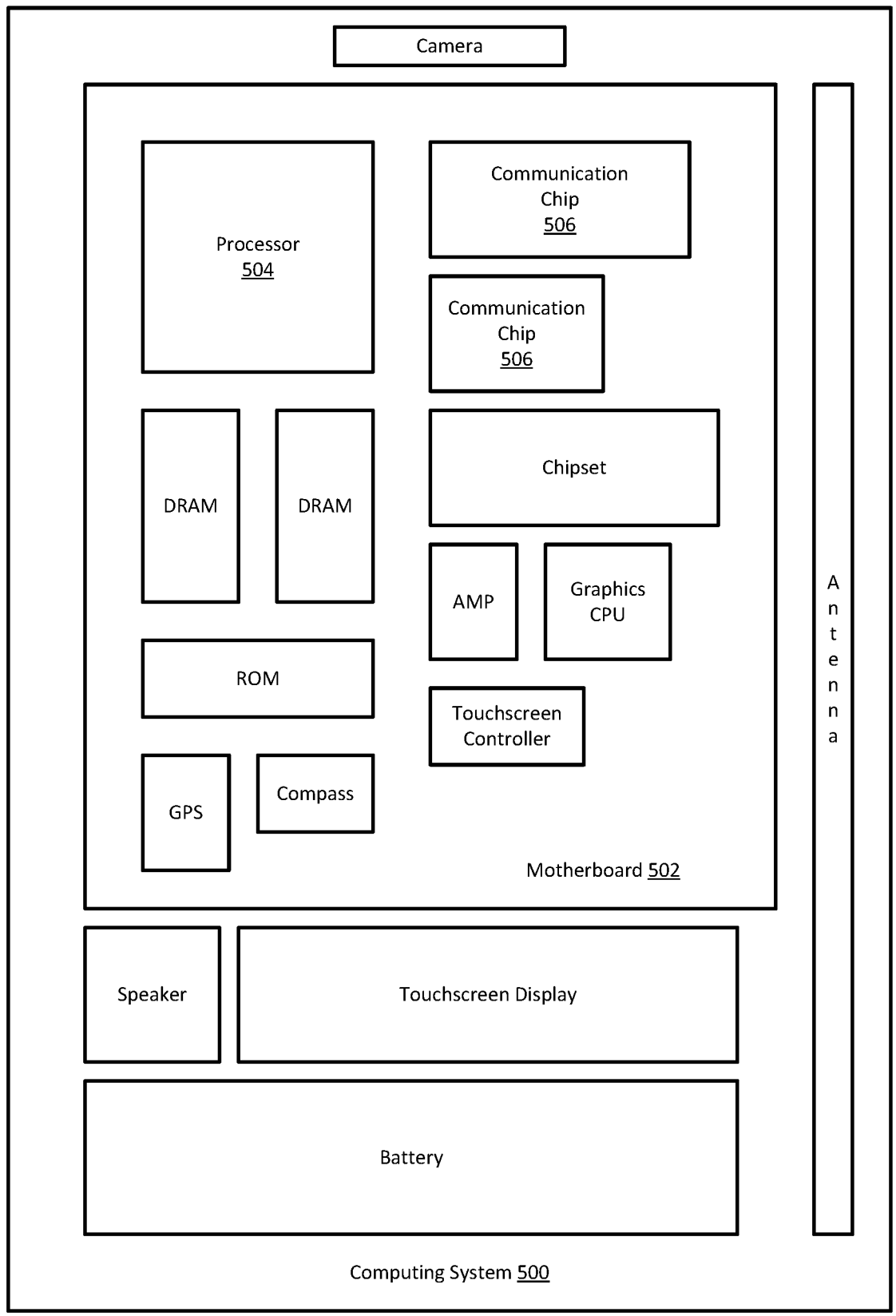
FIG. 5 illustrates a computing system implemented with integrated circuit structures and/or transistor devices formed using the techniques disclosed herein, in accordance with some embodiments of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board, whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., to include one or more HBTs fabricated using a combination of epitaxial growth and LEO, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others. In some embodiments, communication chip 506 may include one or more transistor structures that include an overlapping conductive interconnect, thus forming a multi-reticle die as variously described herein.

The processor 504 of the computing system 500 includes an integrated circuit die packaged within the processor 504. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit device comprising a first device layer; a first plurality of interconnect layers over the first device layer, the interconnect layers comprising a first plurality of conductive interconnects and interlayer dielectric material; a second device layer laterally adjacent to the first device layer and separated from the first device layer by a common scribe zone; a second plurality of interconnect layers over the second device layer, the interconnect layers comprising a second plurality of conductive interconnects and interlayer dielectric material; and an overlapping conductive interconnect comprising a first portion disposed within or on an interconnect layer of the first plurality of interconnect layers, a second portion disposed within or on an interconnect layer of the second plurality of interconnect layers, and a third portion between the first portion and the second portion, the third portion traversing the common scribe zone.

Example 2 includes the subject matter of Example 1, wherein the first portion, the second portion, and the third portion are a continuous conductive interconnect.

Example 3 includes the subject matter of Example 1 or 2, wherein the first device layer and the first plurality of interconnect layers are associated with a first reticle field; and the second device layer and the second plurality of interconnect layers are associated with a second reticle field adjacent to the first reticle field.

Example 4 includes the subject matter of Example 3, wherein at least one of the first reticle field and the second reticle field is 26 mm×33 mm.

Example 5 includes the subject matter of Example 3, wherein the first reticle field comprises a first scribe zone; and the second reticle field comprises a second scribe zone, wherein the first scribe zone overlaps with the second scribe zone within the common scribe zone.

Example 6 includes the subject matter of any of Examples 3 through 5, wherein the third portion of the overlapping conductive interconnect is disposed in the overlap of the first reticle field and the second reticle field.

Example 7 includes the subject matter of any of Examples 5 through 6, wherein the overlap between the first reticle field and the second reticle field is from 10 nm to 500 nm.

Example 8 includes the subject matter of any of the preceding Examples, wherein an interconnect pitch of the first interconnect layer and the second interconnect layer is 100 nm.

Example 9 includes the subject matter of any of the preceding Examples, further comprising an input/output contact in contact with a top interconnect layer of at least one of the first plurality of interconnect layers and the second plurality of interconnect layers, wherein the overlapping conductive interconnect is between the input/output contact and both of the first device layer and the second device layer.

Example 10 includes the subject matter of any of the preceding Examples, wherein the first device layer comprises a first plurality of semiconductor devices; the second device layer comprises a second plurality of semiconductor devices; and the overlapping conductive interconnect connects one or more of the first plurality of semiconductor devices to one or more of the second plurality of semiconductor devices.

Example 11 includes the subject matter of any of the preceding Examples, wherein the common scribe zone comprises photolithographic alignment mark structures.

Example 12 includes the subject matter of any of the preceding Examples, further comprising a die that is larger than 26 mm×33 mm.

Example 13 is a computing device comprising the subject matter of any of Examples 1 through 12.

Example 14 is a method for fabricating an integrated circuit device comprising patterning a photolithographic layer on a substrate within a first reticle field using a reticle having a width; moving the reticle a distance less than the width; and patterning the photolithographic layer within a second reticle field adjacent to the first reticle field, the pattern of the first reticle field and the pattern of the second reticle field overlapping.

Example 15 includes the subject matter of Example 14, wherein the overlap between the first reticle field and the second reticle field is less than 1 micron.

Example 16 includes the subject matter of Example 14, wherein the overlap between the first reticle field and the second reticle field is less than 100 nm.

Example 17 includes the subject matter of any of Examples 14 to 16, further comprising patterning the photolithographic layer repeatedly on a substrate to form a die larger than 33 mm by 26 mm.

Example 18 includes the subject matter of any of Examples 14 to 17, wherein a feature size pitch between features within the pattern of the first reticle field from 20 nm to 100 nm.

Example 19 includes the subject matter of any of Examples 14 to 18, wherein the reticle comprises: a peripheral border corresponding to a scribe zone; a first pattern corresponding to a layer of an integrated circuit within the peripheral border; and a second pattern corresponding to an overlapping conductive interconnect, the second pattern extending into the peripheral border.

Example 20 includes the subject matter of any of Example 19, wherein the scribe zone of the first reticle field and the scribe zone of the second reticle field overlap; and the second pattern in the first reticle field overlaps with the second pattern in the second reticle field within the scribe zone to form the overlapping conductive interconnect from the first reticle field to the second reticle field through the overlap.

What is claimed is:

1. An integrated circuit comprising:
   a first device layer;
   a first plurality of interconnect layers over the first device layer, the first plurality of interconnect layers comprising a first plurality of conductive interconnects and interlayer dielectric material;
   a second device layer laterally adjacent to the first device layer and separated from the first device layer by a common scribe zone;
   a second plurality of interconnect layers over the second device layer, the second plurality of interconnect layers comprising a second plurality of conductive interconnects and interlayer dielectric material;
   a first overlapping conductive interconnect comprising a first portion within or on an interconnect layer of the first plurality of interconnect layers, a second portion within or on an interconnect layer of the second plurality of interconnect layers, and a third portion between the first portion and the second portion, the third portion traversing the common scribe zone; and
   a second overlapping conductive interconnect comprising a first portion within an interconnect layer of the first plurality of interconnect layers, a second portion within an interconnect layer of the second plurality of interconnect layers, and a third portion between the first portion and the second portion, the third portion traversing the common scribe zone, wherein the third portion of the first overlapping conductive interconnect is vertically over the third portion of the second overlapping conductive interconnect.

2. The integrated circuit of claim 1, wherein the first portion, the second portion, and the third portion are a continuous conductive interconnect.

3. The integrated circuit device of claim 1, wherein: the first device layer and the first plurality of interconnect layers are associated with a first reticle field; and the second device layer and the second plurality of interconnect layers are associated with a second reticle field adjacent to the first reticle field.

4. The integrated circuit of claim 3, wherein at least one of the first reticle field and the second reticle field has a size of about 26 mm times 33 mm.

5. The integrated circuit of claim 3, wherein:
   the first reticle field comprises a first scribe zone; and the second reticle field comprises a second scribe zone, wherein the first scribe zone overlaps the second scribe zone within the common scribe zone.

6. The integrated circuit of claim 5, wherein the third portion of the first overlapping conductive interconnect is in the overlap of the first reticle field and the second reticle field.

7. The integrated circuit device of claim 6, wherein the overlap between the first reticle field and the second reticle field is from 10 nm to 500 nm.

8. The integrated circuit of claim 1, wherein an interconnect pitch of the first plurality of interconnect layers and the second plurality of interconnect layers is 100 nm.

9. The integrated circuit of claim 1, further comprising an input/output contact in contact with a top interconnect layer of at least one of the first plurality of interconnect layers and the second plurality of interconnect layers, wherein the first overlapping conductive interconnect is between the input/output contact and both of the first device layer and the second device layer.

10. The integrated circuit of claim 1, wherein:
    the first device layer comprises a first plurality of semiconductor devices;
    the second device layer comprises a second plurality of semiconductor devices; and
    the first overlapping conductive interconnect connects one or more of the first plurality of semiconductor devices to one or more of the second plurality of semiconductor devices.

11. The integrated circuit of claim 10, wherein the first plurality of semiconductor devices includes field effect transistors and the second plurality of semiconductor devices includes control circuits, wherein the control circuits communicate with the field effect transistors via the first overlapping conductive interconnect.

12. The integrated circuit of claim 10, wherein the first device layer comprises a group III-V semiconductor material.

13. The integrated circuit of claim 1, wherein the common scribe zone comprises photolithographic alignment mark structures.

14. The integrated circuit of claim 1, further comprising a die that is larger than 26 mm×33 mm.

15. A computing system comprising the integrated circuit of claim 1.

16. The integrated circuit of claim 1, wherein the first device layer includes memory cores and/or logic cores and wherein the second device layer includes input/output circuits and/or control circuits.

17. The computing system integrated circuit of claim 16, wherein the input/output circuits and/or control circuits of the second device layer are communicatively coupled with the memory cores and/or logic cores of the first device layer.

18. An integrated circuit comprising:
    a first device layer;

a first plurality of interconnect layers over the first device layer, the first plurality of interconnect layers comprising a first plurality of conductive interconnects and interlayer dielectric material;

a second device layer laterally adjacent to the first device layer and separated from the first device layer by a common scribe zone;

a second plurality of interconnect layers over the second device layer, the second plurality of interconnect layers comprising a second plurality of conductive interconnects and interlayer dielectric material; and an overlapping conductive interconnect comprising a first portion within or on an interconnect layer of the first plurality of interconnect layers, a second portion within or on an interconnect layer of the second plurality of interconnect layers, and a third portion between the first portion and the second portion, the third portion traversing the common scribe zone, wherein the first device layer includes memory cores and/or logic cores and wherein the second device layer includes input/output circuits and/or control circuits.

19. The integrated circuit of claim 18, wherein the input/output circuits and/or control circuits of the second device layer are communicatively coupled with the memory cores and/or logic cores of the first device layer.

20. An integrated circuit comprising:
a first device layer;
a first plurality of interconnect layers over the first device layer, the first plurality of interconnect layers comprising a first plurality of conductive interconnects and interlayer dielectric material;

a second device layer laterally adjacent to the first device layer and separated from the first device layer by a common scribe zone;

a second plurality of interconnect layers over the second device layer, the second plurality of interconnect layers comprising a second plurality of conductive interconnects and interlayer dielectric material; and an overlapping conductive interconnect comprising a first portion within or on an interconnect layer of the first plurality of interconnect layers, a second portion within or on an interconnect layer of the second plurality of interconnect layers, and a third portion between the first portion and the second portion, the third portion traversing the common scribe zone, wherein:

the first device layer comprises a first plurality of semiconductor devices;

the second device layer comprises a second plurality of semiconductor devices; and the overlapping conductive interconnect connects one or more of the first plurality of semiconductor devices to one or more of the second plurality of semiconductor devices, and wherein the first plurality of semiconductor devices includes field effect transistors and the second plurality of semiconductor devices includes control circuits, wherein the control circuits communicate with the field effect transistors via the overlapping conductive interconnect.

* * * * *